United States Patent
Anderson et al.

(10) Patent No.: US 9,812,424 B2
(45) Date of Patent: Nov. 7, 2017

(54) PROCESS OF FORMING AN ELECTRONIC DEVICE INCLUDING A BALL BOND

(71) Applicant: SEMICONDUCTOR COMPONENTS INDUSTRIES, LLC, Phoenix, AZ (US)

(72) Inventors: Harold G. Anderson, Chandler, AZ (US); Cang Ngo, Mesa, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/143,797

(22) Filed: May 2, 2016

(65) Prior Publication Data
US 2017/0179074 A1    Jun. 22, 2017

Related U.S. Application Data

(60) Provisional application No. 62/269,251, filed on Dec. 18, 2015.

(51) Int. Cl.
| H01L 21/00 | (2006.01) |
| H01L 23/00 | (2006.01) |

(Continued)

(52) U.S. Cl.
CPC ........ *H01L 24/85* (2013.01); *H01L 21/31111* (2013.01); *H01L 23/49503* (2013.01); *H01L 24/08* (2013.01); *H01L 24/32* (2013.01); *H01L 24/43* (2013.01); *H01L 24/48* (2013.01); *H01L 24/73* (2013.01); *H01L 24/83* (2013.01); *H01L 24/92* (2013.01); *H01L 2224/04042* (2013.01); *H01L 2224/05124* (2013.01); *H01L 2224/05147* (2013.01); *H01L 2224/32245* (2013.01); *H01L 2224/43847* (2013.01); *H01L 2224/45124* (2013.01); *H01L 2224/45139* (2013.01); *H01L 2224/45144* (2013.01); *H01L 2224/45147* (2013.01); *H01L 2224/4813* (2013.01); *H01L 2224/4845* (2013.01); *H01L 2224/48247* (2013.01); *H01L 2224/73265* (2013.01); *H01L 2224/85047* (2013.01); *H01L 2224/85205* (2013.01); *H01L 2224/85345* (2013.01); *H01L 2224/85986* (2013.01); *H01L 2924/20104* (2013.01)

(58) Field of Classification Search
None
See application file for complete search history.

(56) References Cited

U.S. PATENT DOCUMENTS

| 2004/0178250 A1* | 9/2004 | Cherian | ........... B23K 1/0016 228/180.1 |
| 2006/0186179 A1* | 8/2006 | Levine | ........... B23K 20/007 228/180.5 |

(Continued)

*Primary Examiner* — Calvin Choi
(74) *Attorney, Agent, or Firm* — Abel Law Group, LLP

(57) ABSTRACT

A process of forming an electronic device includes providing a wire comprising a first ball at an end thereof, operating on the first ball to modify a surface of the first ball to form a modified surface, moving the first ball to a first location on a die, and bonding the first ball along the modified surface to the first location of the die. In an embodiment, the process further includes moving a bonding tool including the wire away from the die while the wire remains bonded to the die.

19 Claims, 5 Drawing Sheets

(51) Int. Cl.
*H01L 21/311* (2006.01)
*H01L 23/495* (2006.01)

(56) References Cited

U.S. PATENT DOCUMENTS

| | | | |
|---|---|---|---|
| 2010/0200969 A1* | 8/2010 | Huang | H01L 24/45 257/666 |
| 2012/0153435 A1* | 6/2012 | Haba | H01L 23/13 257/532 |

* cited by examiner

PROCESS OF FORMING AN ELECTRONIC DEVICE INCLUDING A BALL BOND

CROSS-REFERENCE TO RELATED APPLICATION(S)

This application claims priority to U.S. Provisional Application No. 62/269,251, filed on Dec. 18, 2015, entitled "Electronic Devices and Process of Forming the Same," invented by Harold G. Anderson and Cang Ngo, and is incorporated herein by reference and priority thereto for common subject matter is hereby claimed.

FIELD OF THE DISCLOSURE

The present disclosure relates to electronic devices, and more particularly to bonding of wire to electronic devices.

RELATED ART

Damage to electronic devices resulting from wire bonding operations is a problem, particularly when material hardness of the wire is greater than material hardness of the surface onto which the wire is bonded. Attempts to address this problem have thus far been insufficient. The electronic device industry continues to demand improved wire bonding techniques and the resulting electronic devices.

BRIEF DESCRIPTION OF THE DRAWINGS

Embodiments are illustrated by way of example and are not limited in the accompanying figures.

Figure 1:
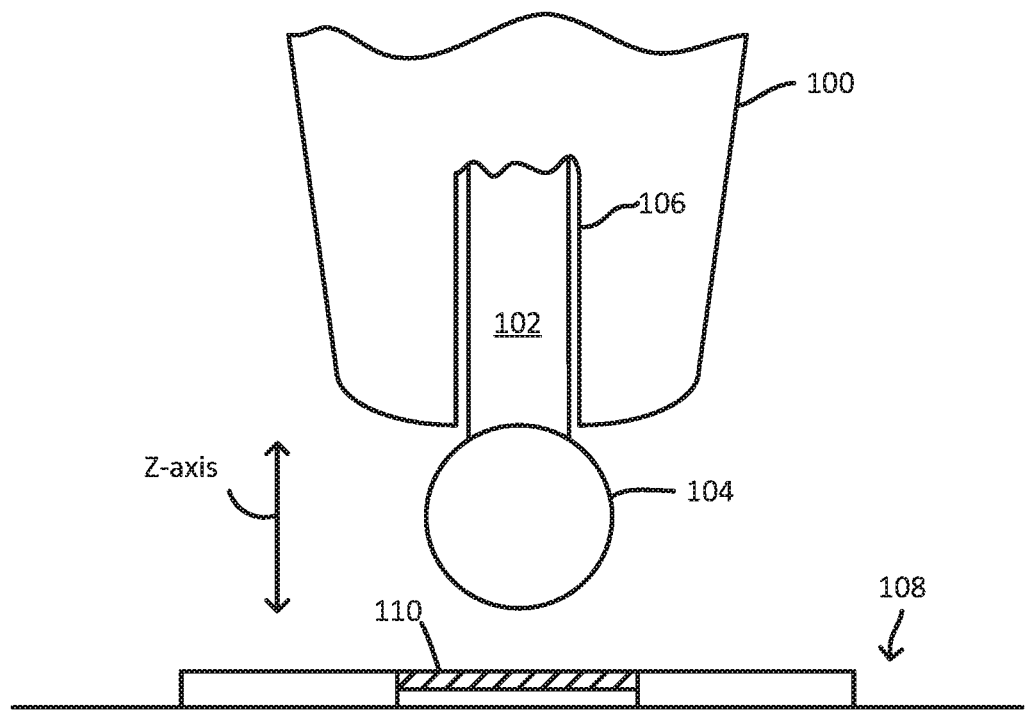
FIG. 1 includes a partial cross-sectional elevation view of a ball bonding operation in accordance with an embodiment after formation of a ball at an end of a wire.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A process of forming an electronic device can include providing a wire including a first ball at an end thereof, operating on the first ball to modify a surface thereof to form a modified surface, moving the first ball to a first location on a die, and bonding the first ball along the modified surface to the first location of the die. In an embodiment, the process can further include moving a bonding tool including the wire away from the die while the wire remains bonded to the die. In another embodiment, the process can further include forming a second ball at a newly formed end of the wire, operating on the second ball to modify a surface of the second ball to form a modified surface, moving the second ball to a location on the die, and bonding the second ball along the modified surface to the second location of the die. In a further embodiment, the die includes a bond pad material exposed at the first location of the die. The modified surface of the first ball can be urged toward, and bonded to, the die such that at least 20% of an original bond pad material thickness remains under the modified surface after bonding is complete. In a particular embodiment, operating on the first ball to modify the surface of the first ball is performed by urging the first ball into an anvil having a material hardness greater than a material hardness of the first ball. The anvil can be disposed on the die, on a tooling, or on a lead frame of the electronic device.

The concepts and design considerations are better understood after reading embodiments that follow. After reading the specification in its entirety, skilled artisans will appreciate that the embodiments are merely for illustrative purposes and do not limit the scope of the appended claims.

FIG. 1 illustrates a bonding tool 100 holding a wire 102 with a ball 104 formed at an end thereof. The wire 102 may extend into the bonding tool 100 through an axial passage 106 extending along a length of the bonding tool 100. A wire feed system can advance the wire 102 through the axial passage 106 to an external environment. In an embodiment, the wire 102 includes a metal such as copper, gold, silver, aluminum, an alloy of any one or more of the previously listed metals, or any combination thereof. In another embodiment, the wire 102 can include a material having a hardness greater than a hardness of a bond pad to which the wire 102 is to be bonded.

After exposing a portion of the wire 102 from the bonding tool 100, the ball 104 can be formed through capillary action caused by exposure of heat. In an embodiment, heat may be introduced through a high-voltage electrical charge such as from an external electrode via electric flame off (EFO). The resulting ball 104 can have an approximately spherical shape extending from the bonding tool 100.

The bonding tool 100 can be moved by one or more actuators along the X- and Y-axis over a die 108 and underlying work space. The die 108 can include one or more semiconductor devices being wire bonded, for example to an interposer or a lead frame (not illustrated). In a particular instance, bonding along the die 108 can be implemented by a plurality of independent or interconnected bonding tools operating concurrently along the work space.

An actuator or other driving device can move the bonding tool 100 along the Z-axis so as to apply downward pressure on the ball 104. During formation of the ball 104 or some time thereafter, the bonding tool 100 can be translated along the X- and Y-axis to a location overlying an anvil 110. In an embodiment, the anvil 110 can be positioned on the die 108. The anvil can be flush with an upper surface of the die 108, recessed therein, or project outward from the die upper surface. In another embodiment, the anvil 110 can be positioned on the lead frame (not illustrated). In yet a further embodiment, the anvil 110 can be positioned on an adjacent tooling, such as a discrete bond process tooling or an existing tooling. In an embodiment, the anvil 110 is non-metallic or includes a non-metallic layer or coating. The anvil 110 can include an oxide or nitride layer. In another embodiment, the anvil 110 can include a non-stick surface to reduce sticking of the ball 104 thereagainst. In a particular embodiment, the non-stick surface of the anvil 110 can include a polymer such as, for example, polytetrafluoroethylene (PTFE) or silicone, a ceramic, sapphire, fused silica, or any combination thereof. In an embodiment, the anvil 110 is disposed on an aluminum surface. In another embodiment, the anvil 110 can be disposed on a substrate including a different material, such as for example, silicon. In a particular embodiment, the anvil 110 can be positioned directly on the different material, such as directly on a portion of underlying silicon. In an embodiment, disposition of certain materials below the anvil 110 can prevent damage to the anvil 110 and underlying materials while forming the modified surface of the ball.

Figure 2:
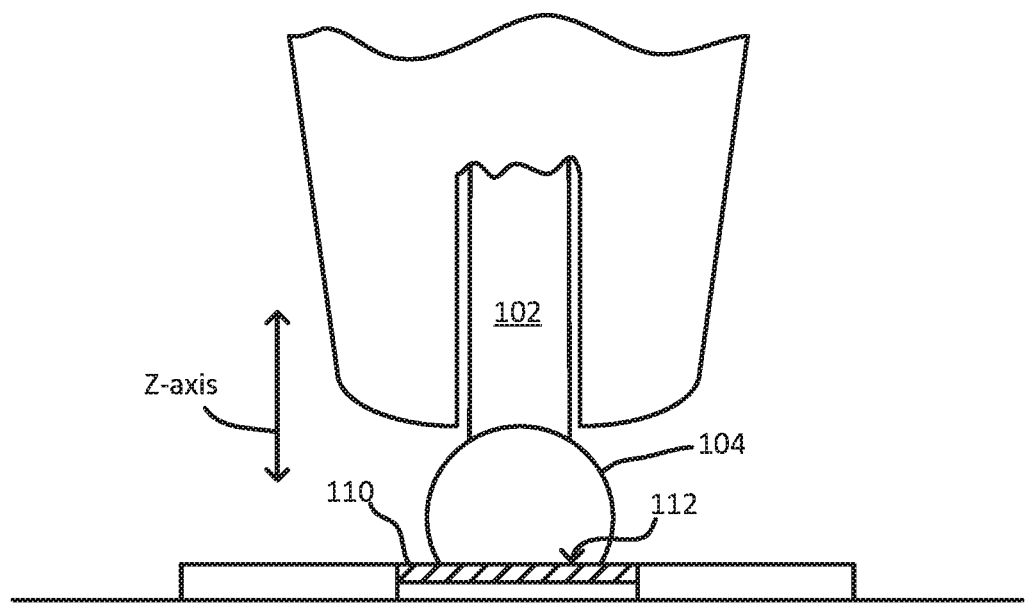
FIG. 2 includes a partial cross-sectional elevation view of the ball bonding operation in accordance with an embodiment while the ball is urged into an anvil to form a modified surface along the ball.
Figure 2A:
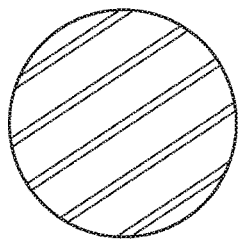
FIGS. 2A to 2I include bottom views of modified surfaces of balls after being driven into an anvil having a corresponding pattern.
Figure 2B:
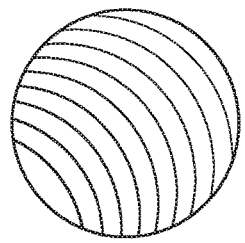
Figure 2C:
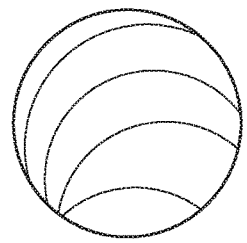
Figure 2D:
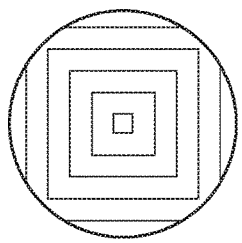
Figure 2E:
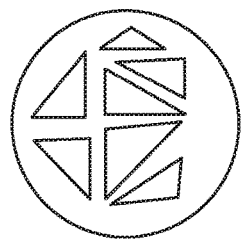
Figure 2F:
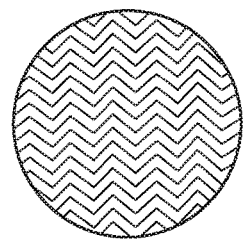
Figure 2G:
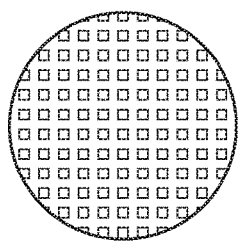
Figure 2H:
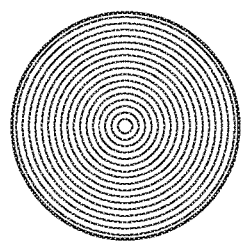
Figure 2I:
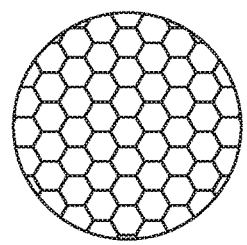

After formation of the ball 104, the bonding tool 100 can drive the ball 104 into the anvil 110, applying sufficient force to modify a surface of the ball 104 to form a modified surface 112. As illustrated in FIG. 2 and in accordance with an embodiment, the modified surface 112 can be planar, or approximately planar when formed against a planar, or approximately planar, anvil 110. A patterning along an exposed surface of the anvil 110 can be transferred to the ball 104 to adjust the modified surface 112. Exemplary patterns include hatchings (FIG. 2A) concentric or nonconcentric arcuate and polygonal shapes (FIG. 2B to 2E), zig-zag patterns dot matrices (FIG. 2G), annular rings (FIG. 2H), honeycombs (FIG. 2I), and combinations thereof. Inclusion of such patterns along the modified surface 112 may increase surface area of the ball 104, improving bonding and bond interface integrity with a bond pad as discussed in greater detail below.

In an embodiment, deformation of the ball 104 can be in a volumetric range between and including 5% and 50%, 10% and 40%, or 10% and 35%. That is, in a particular instance, at least 5% of the volume of the ball 104 can deform as a result of driving the ball 104 into the anvil 110. In another instance, no greater than 35% of the volume of the ball 104 can deform when driving the ball 104 into the anvil 110. A fillet or chamfer can extend around at least a portion of the ball 104 between the modified surface 112 and the approximately spherical portions.

In another embodiment, the modified surface 112 can be formed on the ball 104 using a material removal process such as etching or through a mechanical or laser-type cutting process.

The modified surface 112 of the ball 104 can be disposed generally opposite the wire 102. That is, a spherical portion of the ball 104 can be disposed between the modified surface 112 and the wire 102. In a particular embodiment, the modified surface 112 is disposed diametrically opposite the wire 102. The modified surface 112 can lie along a plane which is generally perpendicular to an axis of the wire 102 just above the ball 104.

Figure 3:
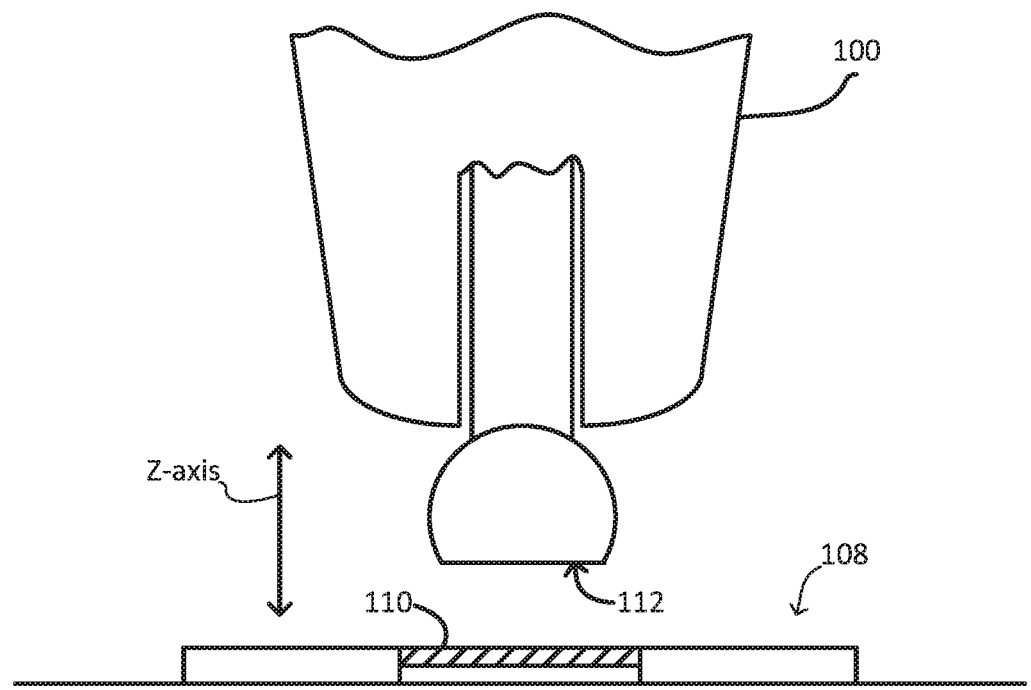
FIG. 3 includes a partial cross-sectional elevation view of the ball bonding operation in accordance with an embodiment after forming the modified surface along the ball.
Figure 4:
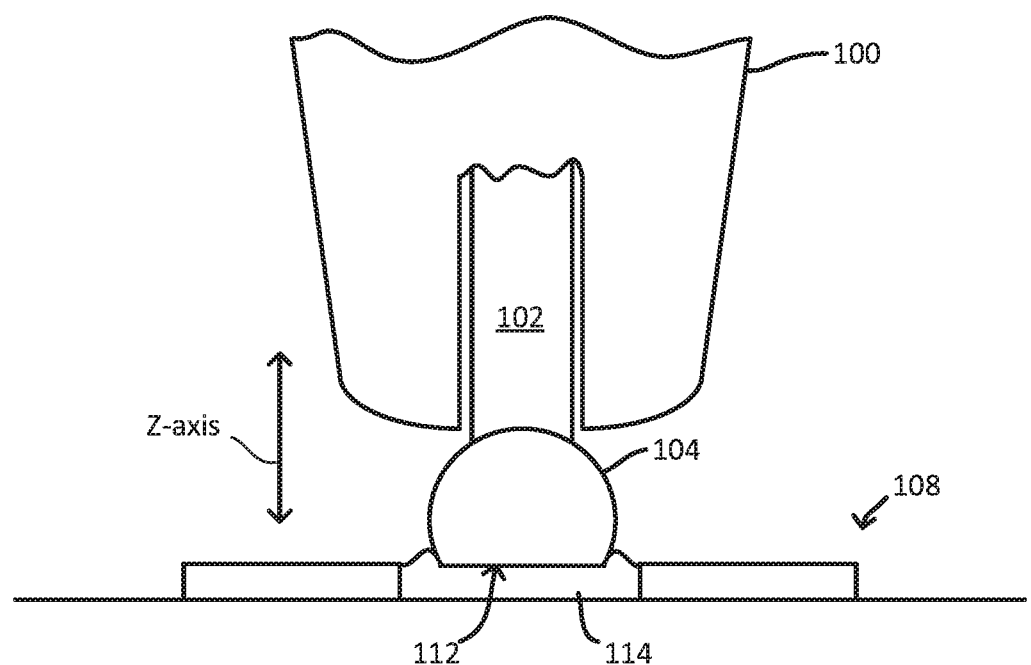
FIG. 4 includes a partial cross-sectional elevation view of the ball bonding operation in accordance with an embodiment while the modified surface of the ball is being bonded to a bond pad of a die.

Referring to FIG. 3, after forming the modified surface 112, the bonding tool 100 can move the ball 104 along the Z-axis in a direction away from the anvil 110. After reaching an appropriate clearance distance above die 108, the bonding tool 100 can translate along the X- and Y-axis until reaching an X- and Y-coordinate under which a bond pad 114 is positioned (FIG. 4). In an embodiment, the bond pad 114 may include a metallic material, such as an aluminum, an aluminum alloy, copper, or a copper alloy where the wt % of copper or aluminum is at least 90% aluminum or copper, respectively. In a more particular embodiment, the wire 102 or ball 104 can include a material having a Vickers Hardness, $H_W$, greater than a Vickers Hardness, $H_{BP}$, of the bond pad 114. For example, in an embodiment, $H_W$ can be at least 1.01 $H_{BP}$, at least 1.1 $H_{BP}$, or at least 2 $H_{BP}$. In a further embodiment, $H_W$ is no greater than 10 $H_{BP}$, or no greater than 5 $H_{BP}$.

After aligning the ball 104 relative to the bond pad 114 along the X- and Y-axis, the bonding tool 100 can drive the ball 104 along the Z-axis toward the die 108, initiating the bonding process of the ball 104 relative to the bond pad 114 (FIG. 4). Unlike with traditional ball bonding operations, the modified surface 112 increases an initial surface area contact between the ball 104 and bond pad 114. This increased surface area contact more uniformly spreads loading forces along the bond pad 114, reducing potential complications resulting from uneven loading pressures such as excessive bond pad material thinning and splashing that could occur if the shape of the ball would not have been modified before contact. Additionally, the modified surface 112 can enhance bond strength, permitting greater surface area contact during the initial stages of ultrasonic vibration.

In an embodiment, the bonding process can be performed using a thermosonic technique where the ball 104 is bonded to the bond pad 114 via an ultrasonic scrubbing process. While pressure is applied from the bonding tool 100 along the Z-axis in the downward direction, an ultrasonic generating element, such as a vibrational transducer, vibrates the bonding tool laterally, scrubbing the ball 104 against the bond pad 114, cleaning the bond pad 114 of oxide and debris, and initiating intermetallic plasticization of the ball 104 and bond pad 114. The ultrasonic scrub can cause formation of an intermetallic weld between the ball 104 and bond pad 114. In certain embodiments, the ball 104 can be heated to an elevated temperature (e.g., 125° C.) prior to or during bonding operation.

In an embodiment, lateral vibration of the bonding tool 100 commences while the ball 104 is spaced apart from the bond pad 114, permitting uninhibited ultrasonic vibration of the ball 104 throughout the entire bonding operation. In a further embodiment, the bonding tool 100 can drive the ball 104 toward the bond pad 114 to a depth below the initial upper surface of the bond pad material. Such overdriving of the ball 104 into the bond pad 114 can push bond pad material against the sidewall of the bond pad 114, reducing unwanted splashing and pooling of the bond pad material.

Whereas traditional ball bonding processes introduce high stress concentration points along bond pads which can result in excessive thinning of bond pad material leaving less than 15% of the original thickness of the bond pad, less than 10% of the original thickness of the bond pad, or less than 5% of the original thickness of the bond pad, bonding techniques described in accordance with embodiments herein can be performed such that a least 20% of an original bond pad material thickness remains under the modified surface 112 of the ball 104 after bonding is complete. In further embodiments, at least 30% of the original bond pad material thickness remains under the ball 104, at least 40% of the original bond pad material thickness remains under the ball 104, or at least 50% of the original bond pad material thickness remains under the ball. Maintenance of sufficient bond pad material thickness can reduce the likelihood of damage to electronic components underlying the bond pad 114. Further, sufficient bond pad material thickness may facilitate desired electrical connectivity of the wire to the bond pad while reducing the likelihood of splashing and electrical shorts or current leakage.

Figure 5:
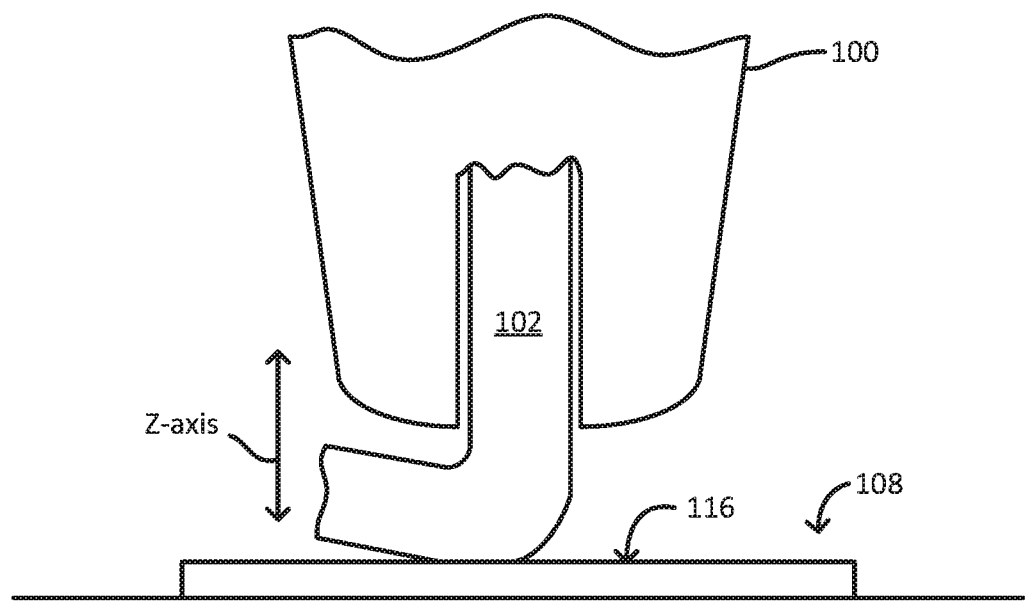
FIG. 5 includes a partial cross-sectional elevation view of the ball bonding operation in accordance with an embodiment while a bonding tool including the wire is moved to a new location while the wire remains bonded to the die.
Figure 6:
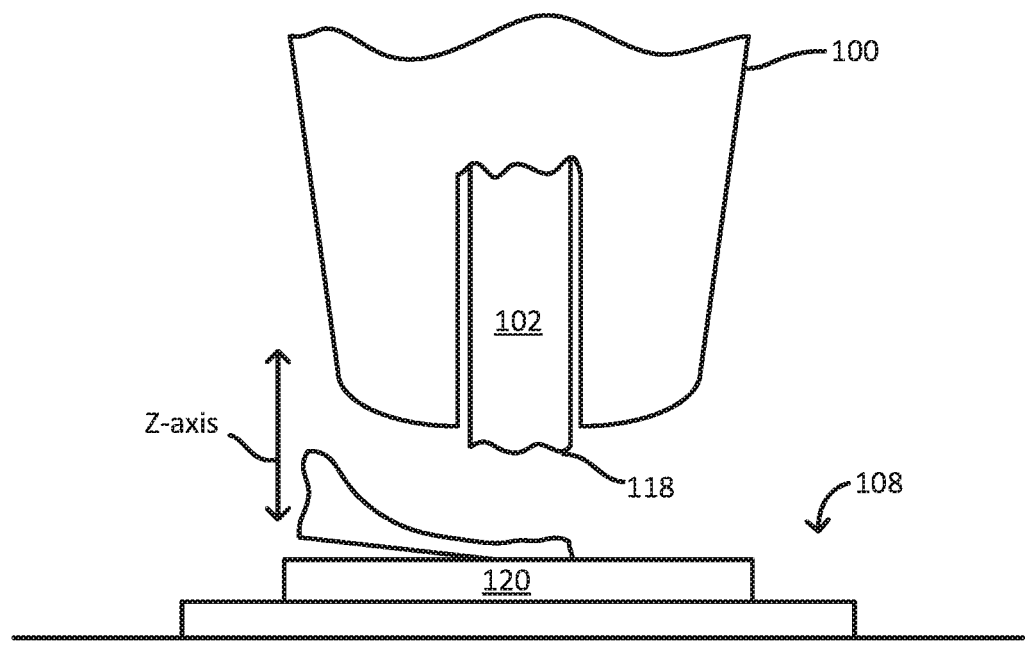
FIG. 6 includes a partial cross-sectional elevation view of the ball bonding operation in accordance with an embodiment after the wire is bonded to the new location and before a new ball is formed.

After bonding the ball 104 to the bond pad 114 is complete, the bonding tool 100 may be translated along the Z-axis in a direction away from the bond pad 114 while the wire 102 remains bonded to the bond pad 114. Referring to FIG. 5, the bonding tool 100 may then be translated in the X- and Y-axis toward another position where the wire 102 is laid against a surface 116 (e.g., a surface of the leadframe/substrate). A second ultrasonic scrub process may then initiate, bonding the wire 102 to a lead of the leadframe/substrate. Again, the bonding tool 100 can apply a force along the Z-axis in a direction toward the leadframe/substrate to facilitate ultrasonic bonding. In a particular instance, lateral vibration of the bonding tool 100 can commence while the wire 102 is spaced apart from the surface 116. After completion of the bonding process, the bonding tool 100 can drive toward to the lead into the wire 102, at least partially slicing the wire 102 in situ. The bonding tool 100 can then be translated away from the surface 116, breaking the bonded wire to form a newly exposed portion of wire 118 (FIG. 6).

The bonding tool 100 may then repeat the above described steps to form additional bonds, such as for example, a second bond, a third bond, and a fourth bond. The additional bonds can be formed using a process having similar process steps as described above. For example, a new (second) ball can be formed along the newly exposed portion of wire 118. The new ball may be driven into the anvil to form a modified surface which is then ultrasonically welded to a different bond pad. This process can then be repeated as required to sufficiently wire the electronic device.

In another embodiment, bonding can occur through a bond stich on ball process where the wire is sliced at a location proximate to the ball after the ball is bonded to a bond pad. The wire is then bonded to a surface of the leadframe/substrate using an optional ball bond technique. The wire can then be translated to the ball bonded to the bond pad while the wire remains bonded to the surface of the leadframe/substrate where the wire is stitch bonded to the ball attached to the bond pad.

In a particular instance, the die 108 may include one or more layers, such as passivation layers, over the bond pad 114 prior to bonding operations. These layers can be etched, such as through a selective etching process, to expose the bond pads 114 prior bonding operations.

Referring to FIG. 6, in certain embodiments the die 108 can be attachable to a flag 120 disposed on a lead frame 122. The wire 102 can be bonded to the flag 120 or leadframe/substrate (not illustrated) in addition to being bonded to the bond pads of the die 108.

Figure 7:
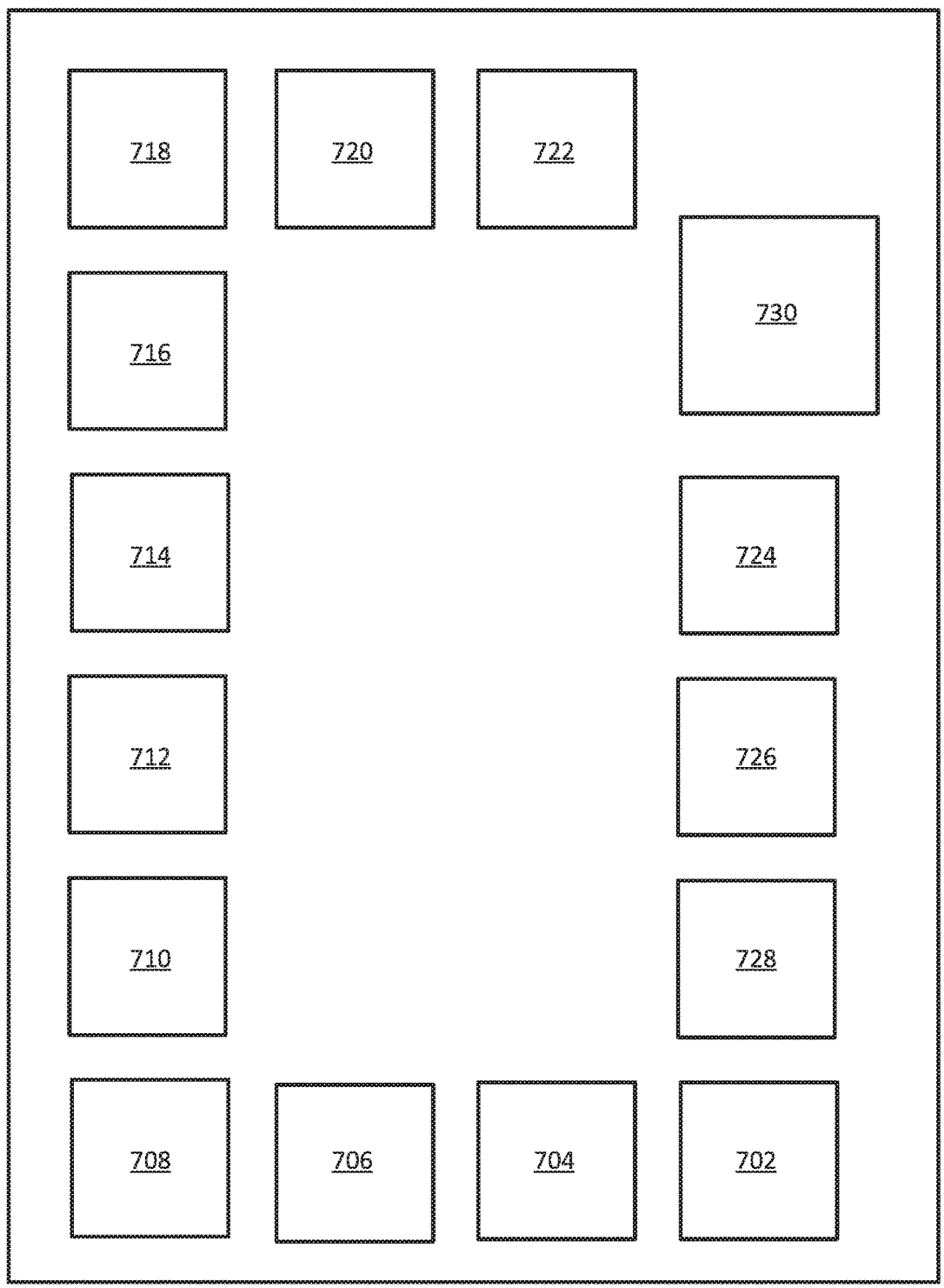
FIG. 7 includes a top view of an exemplary die layout in accordance with an embodiment.

An exemplary die configuration is illustrated in FIG. 7. Die 700 can include bond pads 702, 704, 706, 708, 710, 712, 714, 716, 718, 720, 722, 724, 726, and 728. The bond pads 702, 704, 706, 708, 710, 712, 714, 716, 718, 720, 722, 724, 726, and 728 can be distributed along the die 700 as illustrated or along another arrangement. An anvil 730 positioned on the die 700 may be disposed, for example, between adjacent bond pads 722 and 724. By way of example, the bonding tool 100 can move first to the anvil 730, where the ball is modified to include a modified surface. The bonding tool 100 can then move to a location over bond pad 702. After bonding at bond pad 702 is complete and the wire is attached to a secondary location (e.g., the leadframe/substrate), the bonding tool 100 can again translate to the anvil 730 where a ball formed on a newly exposed portion of wire is modified to form a modified surface. The bonding tool 100 can then translate, for example, to bonding pad 704 where the ball can be bonded. This process can be repeated until all bond pads 702, 704, 706, 708, 710, 712, 714, 716, 718, 720, 722, 724, 726, and 728 are bonded.

Processes and devices in accordance with one or more of the embodiments described herein may permit enhanced bonding operations, increasing surface area of the ball to be bonded such that initial force between the ball and bond pad is more uniformly distributed, resulting in enhanced bond strength.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

A process of forming an electronic device comprising:
providing a wire comprising a first ball at an end thereof;
operating on the first ball to modify a surface of the first ball to form a modified surface;
moving the first ball to a first location on a die; and
bonding the first ball along the modified surface to the first location of the die.

Embodiment 2

The process of embodiment 1, further comprising:
moving a bonding tool including the wire away from the die while the wire remains bonded to the die.

Embodiment 3

The process of embodiment 2, further comprising:
forming a second ball at a newly formed end of the wire;
operating on the second ball to modify a surface of the second ball to form a modified surface;
moving the second ball to a second location on the die; and
bonding the second ball along the modified surface to the second location of the die.

Embodiment 4

The process of embodiment 1, wherein the die comprises a bond pad material exposed at the first location and bonding the modified surface of the first ball to the die is performed such that at least 20% of an original bond pad material thickness remains under the modified surface after bonding is complete.

Embodiment 5

The process of embodiment 1, wherein operating on the first ball is performed by:
urging the first ball into an anvil having a material hardness greater than a material hardness of the first ball.

Embodiment 6

The process of embodiment 5, wherein the anvil is disposed on the die, a tooling, or a lead frame.

Embodiment 7

The process of embodiment 1, further comprising:
etching a passivation layer of the die at the first location to expose a bond pad prior to bonding the first ball to the first location.

Embodiment 8

The process of embodiment 7, wherein the wire comprises a material having a material hardness greater than a material hardness of the bond pad.

Embodiment 9

The process of embodiment 7, wherein the bond pad comprises aluminum, an aluminum alloy, copper or copper alloy, and wherein the wire comprises a core comprising copper or a copper alloy.

Embodiment 10

The process of embodiment 1, wherein forming the modified surface of the first ball comprises forming a pattern along the first ball.

Embodiment 11

The process of embodiment 1, wherein the wire comprises a material selected from a group consisting of gold, copper, silver, and aluminum.

Embodiment 12

The process of embodiment 1, further comprising attaching the die to a flag of a lead frame.

Embodiment 13

A process of forming an electronic device comprising:
forming a first bond, wherein forming the first bond comprises:
  forming a modified surface along a first ball at an end of a wire;
  bonding the first ball along the modified surface to a first location of a die; and
  moving a bonding tool including the wire away from the die while the first ball remains bonded to the die;
forming a second bond, wherein forming the second bond comprises:
  forming a modified surface along a second ball at a newly formed end of the wire;
  bonding the second ball along the modified surface to a second location of the die; and
  moving the bonding tool including the wire away from the die while the second ball remains bonded to the die.

Embodiment 14

The process of embodiment 13, wherein forming the modified surface along at least one of the first and second balls comprises urging the first or second ball into an anvil with sufficient force to cause volumetric deformation thereof.

Embodiment 15

The process of embodiment 14, wherein volumetric deformation of the first or second ball is in a range between and including 5% and 50%, 10% and 40%, or 10% and 35%.

Embodiment 16

The process of embodiment 14, wherein the anvil is disposed on the die, and wherein the wire moves to the anvil at a time between forming the first bond and the second bond.

Embodiment 17

The process of embodiment 13, wherein forming the generally planar surface of the first ball comprises forming a pattern along the modified surface.

Embodiment 18

The process of embodiment 17, wherein the anvil comprises a surface including a pattern, and wherein forming the pattern along the modified surface is performed by urging the modified surface into the pattern along the surface of the anvil.

Embodiment 19

The process of embodiment 13, wherein moving the bonding tool away from the die while the first ball remains bonded to the die further comprises:
bonding the wire to a lead frame.

Embodiment 20

An electronic device comprising:
a die comprising:
a substrate; and
an anvil disposed above a surface of the substrate,
wherein a material hardness of the anvil is greater than a material hardness of the substrate.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
providing a wire comprising a first ball at an end thereof;
operating on the first ball to modify a surface of the first ball to form a modified surface;
moving the first ball to a first location on a die; and
bonding the first ball along the modified surface to the first location of the die,
wherein the modified surface comprises a pattern including a hatching, a concentric arcuate shape, a nonconcentric arcuate shape, a concentric polygonal shape, a nonconcentric polygonal shape, a zig-zag pattern, a dot matrix, a honeycomb, or any combination thereof.

2. The process of claim 1, further comprising:
moving a bonding tool including the wire away from the die while the wire remains bonded to the die.

3. The process of claim 2, further comprising:
forming a second ball at a newly formed end of the wire;
operating on the second ball to modify a surface of the second ball to form a modified surface;
moving the second ball to a second location on the die; and
bonding the second ball along the modified surface to the second location of the die.

4. The process of claim 1, wherein the die comprises a bond pad material exposed at the first location and bonding the modified surface of the first ball to the die is performed such that at least 20% of an original bond pad material thickness remains under the modified surface after bonding is complete.

5. The process of claim 1, wherein operating on the first ball is performed by:
urging the first ball into an anvil having a material hardness greater than a material hardness of the first ball.

6. The process of claim 5, wherein the anvil is disposed on the die, a tooling, or a lead frame.

7. The process of claim 1, further comprising:
etching a passivation layer of the die at the first location to expose a bond pad prior to bonding the first ball to the first location.

8. The process of claim 7, wherein the wire comprises a material having a material hardness greater than a material hardness of the bond pad.

9. The process of claim 7, wherein the bond pad comprises aluminum, an aluminum alloy, copper, or copper alloy, and wherein the wire comprises a core comprising copper or a copper alloy.

10. The process of claim 1, wherein the pattern includes concentric shapes.

11. The process of claim 1, wherein the wire comprises a material selected from a group consisting of gold, copper, silver, and aluminum.

12. The process of claim 1, further comprising attaching the die to a flag of a lead frame.

13. A process of forming an electronic device comprising:
forming a first bond, wherein forming the first bond comprises:
  forming a modified surface along a first ball at an end of a wire;
  bonding the first ball along the modified surface to a first location of a die; and
  moving a bonding tool including the wire away from the die while the first ball remains bonded to the die;
forming a second bond, wherein forming the second bond comprises:
  forming a modified surface along a second ball at a newly formed end of the wire;
  bonding the second ball along the modified surface to a second location of the die; and
  moving the bonding tool including the wire away from the die while the second ball remains bonded to the die,
wherein an anvil is disposed at a third location of the die, and wherein forming the modified surface along the first and second balls comprises urging the first and second ball, respectively, into the anvil with sufficient force to cause volumetric deformation thereof.

14. The process of claim 13, wherein the modified surface along at least one of the first ball and the second ball includes a patterned modified surface.

15. The process of claim 13, wherein volumetric deformation of the first or second ball is in a range between and including 5% and 50%.

16. The process of claim 13, wherein the wire moves to the anvil at a time between forming the first bond and the second bond.

17. The process of claim 13, wherein the patterned modified surface of the first ball includes a hatching, a concentric arcuate shape, a nonconcentric arcuate shape, a concentric polygonal shape, a nonconcentric polygonal shape, a zig-zag pattern, a dot matrix, a honeycomb, and any combination thereof.

18. The process of claim 13, wherein the anvil comprises a surface including a pattern, and wherein forming the pattern along the modified surface is performed by urging the modified surface into the pattern along the surface of the anvil.

19. The process of claim 13, wherein moving the bonding tool away from the die while the first ball remains bonded to the die further comprises:
  bonding the wire to a lead frame.

* * * * *